United States Patent
Lee et al.

(10) Patent No.: US 10,673,227 B2
(45) Date of Patent: Jun. 2, 2020

(54) SYSTEM LEVEL ESD DETECTION DEVICE AND RESTART SYSTEM USING THE SAME

(71) Applicant: SK hynix Inc., Gyeonggi-do (KR)

(72) Inventors: Sung-Ryong Lee, Gyeonggi-do (KR); Kang-Bong Seo, Gyeonggi-do (KR); Ik-Seok Yang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 306 days.

(21) Appl. No.: 15/674,666

(22) Filed: Aug. 11, 2017

(65) Prior Publication Data

US 2018/0062378 A1 Mar. 1, 2018

(30) Foreign Application Priority Data

Aug. 23, 2016 (KR) .................. 10-2016-0106669

(51) Int. Cl.
| | | |
|---|---|---|
| *H02H 3/26* | (2006.01) | |
| *H02H 9/04* | (2006.01) | |
| *G01R 25/00* | (2006.01) | |
| *G01R 31/00* | (2006.01) | |
| *H02H 1/00* | (2006.01) | |
| *H02H 3/06* | (2006.01) | |
| *H05K 9/00* | (2006.01) | |

(52) U.S. Cl.
CPC ........... *H02H 3/265* (2013.01); *G01R 25/005* (2013.01); *G01R 31/001* (2013.01); *H02H 1/0007* (2013.01); *H02H 1/0061* (2013.01); *H02H 3/06* (2013.01); *H02H 9/046* (2013.01); *H02H 9/04* (2013.01); *H02H 9/041* (2013.01); *H05K 9/0067* (2013.01)

(58) Field of Classification Search
USPC .......................................... 361/56, 91.1, 111
See application file for complete search history.

(56) References Cited

U.S. PATENT DOCUMENTS

| | | | | |
|---|---|---|---|---|
| 5,999,392 A | * | 12/1999 | Sung ...................... | H02H 9/046 361/111 |
| 7,474,128 B2 | * | 1/2009 | Chou ............... | G01R 19/16552 324/764.01 |
| 2010/0219792 A1 | * | 9/2010 | Tsumura ............... | H01M 2/348 320/116 |
| 2015/0070807 A1 | * | 3/2015 | Baek ...................... | H02H 9/046 361/86 |
| 2015/0194802 A1 | * | 7/2015 | Zhu ..................... | H04L 25/0272 361/86 |
| 2016/0043542 A1 | * | 2/2016 | Peachey ................. | H02H 9/046 361/56 |

* cited by examiner

*Primary Examiner* — Danny Nguyen
(74) *Attorney, Agent, or Firm* — IP & T Group LLP

(57) ABSTRACT

A system level electrostatic discharge (ESD) detection device includes a phase detection unit including at least one phase detector suitable for detecting a phase difference between a plurality of supply voltages or between a plurality of input signals; a storage unit suitable for shifting between a first and a second state, the second state indicating a phase difference detected by the phase detection unit; and an output unit suitable for outputting a system level electrostatic discharge (ESD) detection signal according to the first or second state of the storage unit.

17 Claims, 12 Drawing Sheets

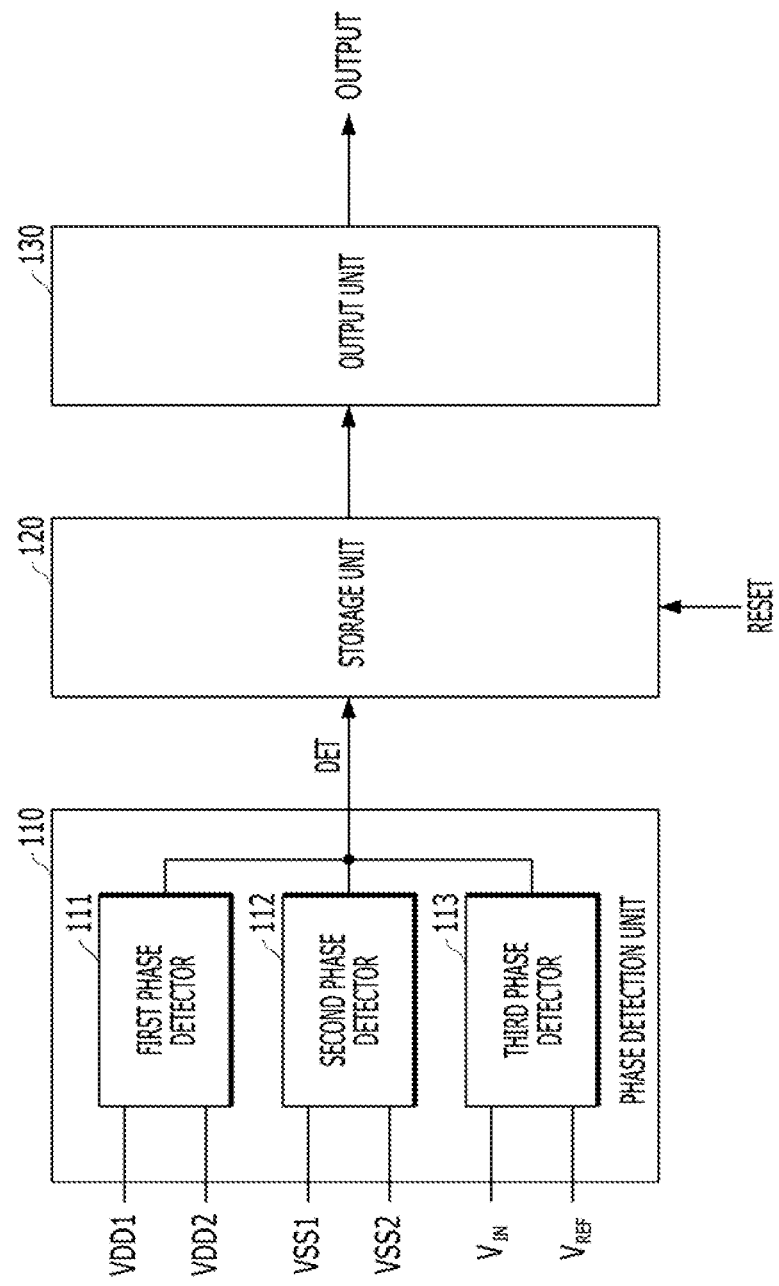

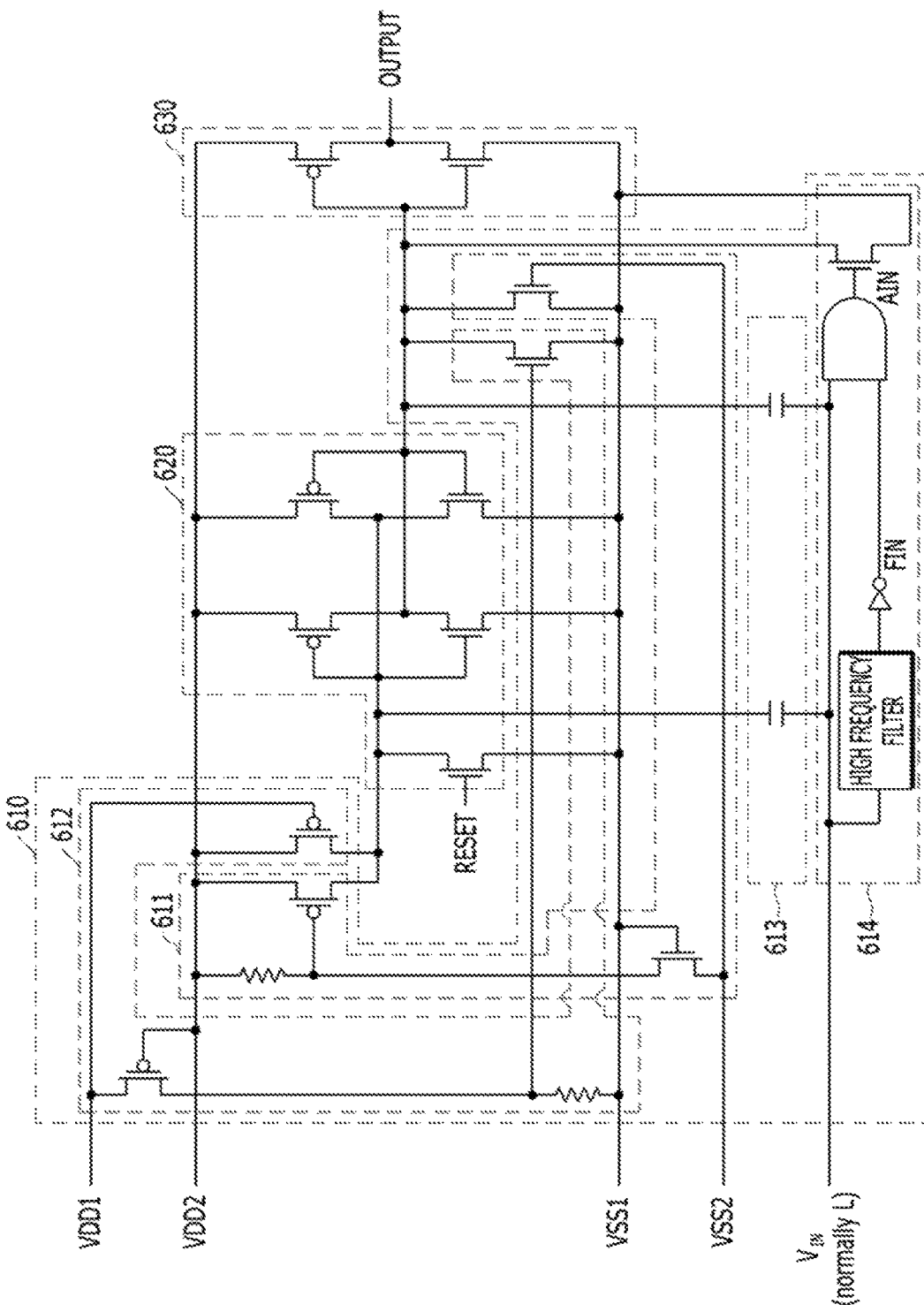

SYSTEM LEVEL ESD DETECTION DEVICE AND RESTART SYSTEM USING THE SAME

CROSS-REFERENCE TO RELATED APPLICATIONS

The present application claims priority of Korean Patent Application No. 10-2016-0106669, filed on Aug. 23, 2016, which is incorporated herein by reference in its entirety.

BACKGROUND

1. Field

Exemplary embodiments of the present invention relate to a system level electrostatic discharge (ESD) detection device and a restart system for restarting a corresponding system using the same.

2. Description of the Related Art

In general, an electrostatic may be applied to a semiconductor circuit according to two classifications. A first classification is that an electrostatic is applied to a semiconductor circuit while the semiconductor circuit is transferred or manufactured, a physical damage occurs in the semiconductor circuit, and the semiconductor circuit cannot be used permanently.

A second classification is that after a semiconductor circuit is mounted on an electronic device, when the electronic device is in operation, an electrostatic may be applied to the semiconductor circuit, a physical damage occurs or a power system has an error, and the electronic device performs a malfunction.

Herein, the second classification is referred to as a system level electrostatic discharge (ESD), and is managed differently from the ESD of the first classification.

The system level electrostatic discharge accompanies a malfunction in most of cases (e.g., 99%). If the system level electrostatic discharge is detected, a corresponding system may be restarted to operate normally.

More specifically, when an electronic device operates, if an electrostatic is applied to the electronic device, a serious hard-fail or a soft-fail may occur in the electronic device. The soft-fail indicates a case that the electronic device stops for a certain time and then operates normally when a power is re-switched. In the case of the soft-fail, if an error of a circuit is automatically detected and the circuit is automatically restarted, the electronic device may operate without the recognition of the user.

SUMMARY

Various embodiments of the present invention are directed to a system level electrostatic discharge detection device for detecting a system level electrostatic discharge by storing a phase difference between a plurality of supply voltages or between a plurality of input signals.

Various embodiments of the present invention are directed to a restart system for restarting a corresponding system using a system level electrostatic discharge detection signal detected by a system level electrostatic discharge detection device.

In an embodiment of the present invention, a system level electrostatic discharge (ESD) detection device may include a phase detection unit including at least one phase detector suitable for detecting a phase difference between a plurality of supply voltages or between a plurality of input signals; a storage unit suitable for shifting between a first and a second state, the second state indicating a phase difference detected by the phase detection unit; and an output unit suitable for outputting a system level electrostatic discharge (ESD) detection signal according to the first or second state of the storage unit.

The phase detection unit may include at east one of a first phase detector suitable for detecting a phase difference between a first power supply voltage and a second power supply voltage; a second phase detector suitable for detecting a phase difference between a first ground voltage and a second ground voltage; and a third phase detector suitable for detecting a phase difference between a first input signal and a second input signal, wherein the phase detection unit outputs a phase difference detection signal to the storage unit according to the phase difference detected by at least one of the first phase detector, the second phase detector and the third phase detector.

In another embodiment of the present invention, a restart system may include a system level electrostatic discharge (ESD) detection device suitable for detecting a phase difference between a plurality of supply voltages or between a plurality of input signals, and outputting a system level electrostatic discharge (ESD) detection signal; a restart control unit suitable for generating a restart control signal for controlling a restart operation according to the system level ESD detection signal; and an operation circuit suitable for performing the restart operation according to the restart control signal.

In another embodiment of the present invention, a restart system may include a system level electrostatic discharge (ESD) detection device suitable for detecting a phase difference between a plurality of supply voltages or between a plurality of input signals, and outputting a system level electrostatic discharge (ESD) detection signal; an application system suitable for outputting restart instruction signal for instructing a restart operation according to the system level ESD detection signal; a restart control unit suitable for generating a restart control signal for controlling the restart operation according to the restart instruction signal; and an operation circuit suitable for performing the restart operation according to the restart control signal.

BRIEF DESCRIPTION OF THE DRAWINGS

FIG. 1A is a block diagram illustrating a system level electrostatic discharge detection device, in accordance with an embodiment of the present invention.

FIG. 6 is a circuit diagram illustrating a system level electrostatic discharge detection device using a ground voltage, a power supply voltage, an input signal and an input signal having a relatively large phase variation, in accordance with an embodiment of the present invention.

DETAILED DESCRIPTION

Figure 1B:
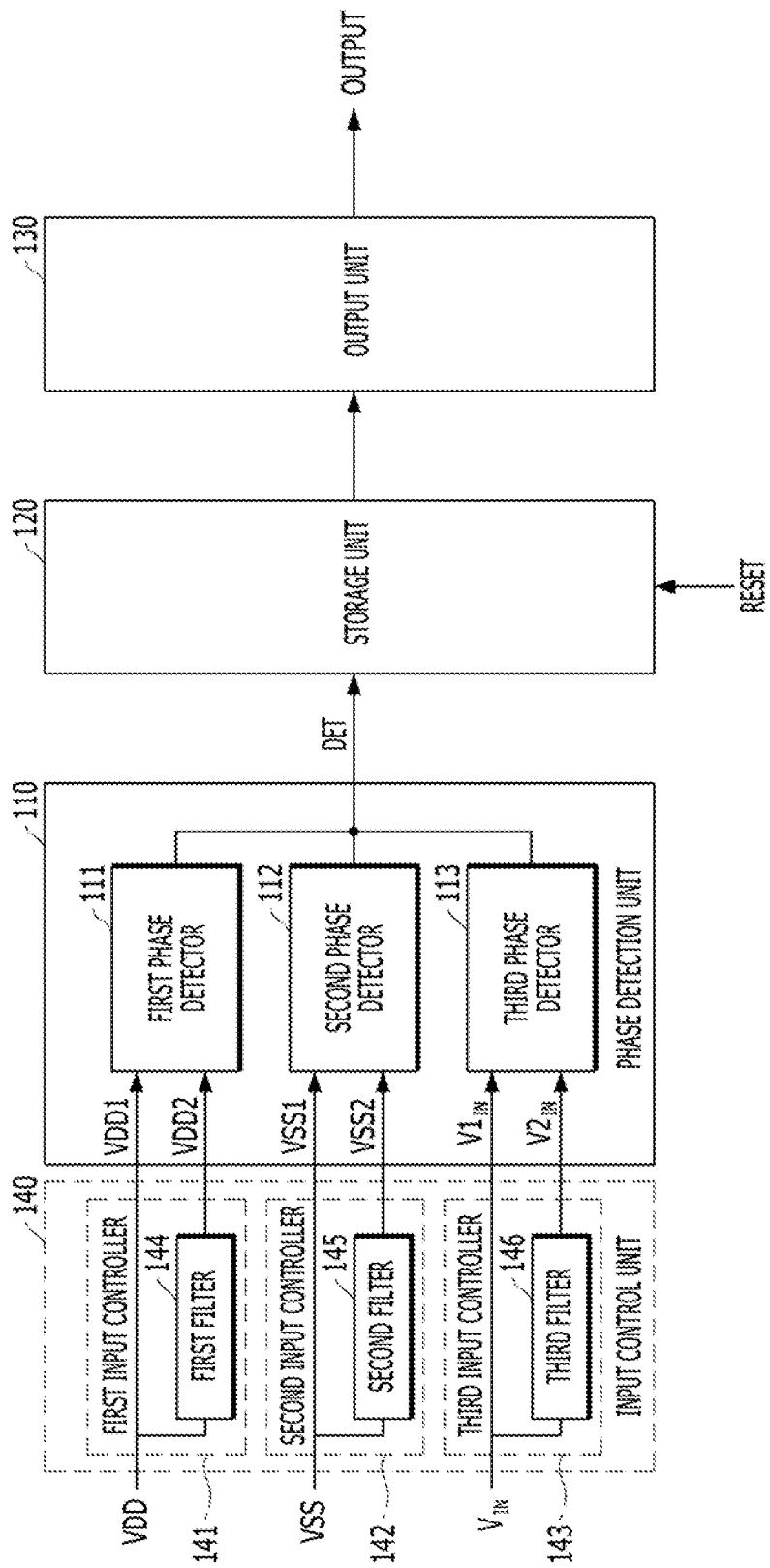
FIG. 1B is a block diagram illustrating a system level electrostatic discharge detection device, in accordance with an embodiment of the present invention.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Throughout the specification, when an element is referred to as being "coupled" to another element, it may not only indicate that the elements are "directly coupled" to each other, but also indicate that the elements are "electrically coupled" to each other with another element interposed therebetween.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily drawn to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail to avoid unnecessarily obscuring the present invention.

It is also noted, that in some instances, as would be apparent to those skilled in the relevant art, a feature or element described in connection with one embodiment may be used singly or in combination with other features or elements of another embodiment, unless otherwise specifically indicated.

A technical principle of the present invention will be simply described as below.

If a system level electrostatic discharge occurs during an operation of an electronic product, e.g., an electronic system, ripples may occur in a power supply voltage or an input signal due to the system level electrostatic discharge. Since the ripples may be transferred to a semiconductor circuit in the electronic system through a different transfer path, a phase difference between the ripples, which are transferred to the semiconductor circuit, may occur. Herein, if the phase difference is detected using at least one phase detector, and a detected phase difference is stored in a storage unit, the occurrence of the system level electrostatic discharge may be stably detected, and may be transferred to a restart control unit or an application processor. Thus, the application processor may instruct a restart signal such that the semiconductor circuit of performing a malfunction restarts, or the semiconductor circuit may restart according to a control of the restart control unit.

FIG. 1A is a block diagram illustrating a system level electrostatic discharge detection device, in accordance with an embodiment of the present invention.

Referring to FIG. 1A, a system level electrostatic discharge detection device includes a phase detection unit 110, a storage unit 120 and an output unit 130.

The phase detection unit 110 includes at least one phase detector, e.g., a first phase detector 111, a second phase detector 112 and a third phase detector 113, for detecting a phase difference between a plurality of supply voltages or between a plurality of input signals. The storage unit 120 stores the phase difference detected by the phase detection unit 110. The output unit 130 outputs a system level electrostatic discharge detection signal OUTPUT according to the phase difference stored in the storage unit 120.

An operation of the system level electrostatic discharge detection device will be described as below.

First, the storage unit 120 is initialized in response to a reset signal RESET, and the output unit 130 is initialized according thereto. Upon initialization of the output unit, the system level electrostatic discharge detection signal OUTPUT is inactivated to a logic low level. When a phase difference between the plurality of supply voltages or between the plurality of input signals is not detected by the phase detection unit 110, the storage unit 120 and the output unit 130 maintain their initialization states.

When a phase difference between the plurality of supply voltages or between the plurality of input signals is detected by the phase detection unit 110 the storage unit 120 and the output unit 130 perform a system level electrostatic discharge detection operation, and output the system level electrostatic discharge detection signal OUTPUT activated to a logic high level, which indicates the occurrence of the system level electrostatic discharge.

More specifically, the first phase detector 111 detects a phase difference between a first power supply voltage VDD1 and a second power supply voltage VDD2. The second phase detector 112 detects a phase difference between a first ground voltage VSS1 and a second ground voltage VSS2. The third phase detector detects a first input signal $V_{IN}$ and a second input signal $V_{REF}$. When at least one of the first phase detector 111, the second phase detector 112 and the third phase detector of the phase detection unit 110 detects a phase difference, the phase detection unit 110 outputs a phase difference detection signal DET to the storage unit 120.

The storage unit 120 shifts the initialization state to a phase difference occurrence state according to the phase difference detection signal DET outputted from the phase detection unit, and stores a phase difference state. For example the initialization state may be a first logic voltage value and the phase difference state may be a shifted logic voltage value. In an embodiment, the storage unit 120 may be implemented with a etch circuit or a memory suitable for shifting from an initialization state to a phase difference state and for storing the phase difference state.

While the storage unit 120 is in the phase difference state, the output unit 130 outputs the system level electrostatic discharge detection signal OUTPUT to a restart control unit (not shown) or an application processor (not shown) indicating the phase difference occurrence state of the storage unit 120.

The system level electrostatic discharge detection device shown in FIG. 1A is suitable for detecting a phase difference between the plurality of power supply voltages, between the plurality of ground voltages, or between a plurality of input signals. Thus, in case that a single power supply voltage or a single input signal are provided, the system level electrostatic discharge detection device shown in FIG. 1A may not be used.

Referring to FIG. 1B, a system level electrostatic discharge detection device is provided that receives a single power supply voltage, a single ground voltage or a single input signal. The system level electrostatic discharge detection device in accordance with the embodiment of FIG. 1B may further include an input control unit 140 having at least one input controller, e.g., a first input controller 141, a second input controller 142 and a third input controller 143 respectively corresponding to the single power supply voltage, the single ground voltage or the single input signal.

The first input controller 141, the second input controller 142 and the third input controller 143 may be implemented using a filter or a delay circuit. The first input controller 141, the second input controller 142 and the third input controller 143 generating a plurality of power supply voltages VDD1 and VDD2, a plurality of ground voltages VSS1 and VSS2 and/or a plurality of input signals $V1_{IN}$ and $V2_{IN}$ using the single power supply voltage VDD, the single ground voltage VSS or the single input signal $V_{IN}$, respectively. Hence, although only a single power supply voltage VDD, a single ground voltage VSS or a single input signal $V_{IN}$ is provided, the system level electrostatic discharge detection device of FIG. 1B can detect the phase difference between the plurality of power supply voltages VDD1 and VDD2, the plurality of ground voltages VSS1 and VSS2 and/or the plurality of input signals $V1_{IN}$ and $V2_{IN}$ using the phase detection unit 110. Then, the phase detection unit 110 outputs a phase difference detection signal DET to the storage unit 120.

More specifically, the first input controller 141 bypasses the single power supply voltage VDD as a first power supply voltage VDD1 to the first phase detector 111. The first input controller 141 provides a second power supply voltage VDD2 to the first phase detector 111 by passing the single power supply voltage VDD through a first filter 144. The second input controller 142 bypasses the single ground voltage VSS as a first ground voltage VSS1 to the second phase detector 112. The second input controller 142 provides a second ground voltage VSS2 to the second phase detector 112 by passing the single ground voltage VSS through a second filter 145. The third input controller 143 bypasses the single input signal $V_{IN}$ as a first input signal $V1_{IN}$ to the third phase detector 113. The third input controller 143 provides a second input signal $V2_{IN}$ to the third phase detector 113 by passing the single input signal $V_{IN}$ through a third filter 146. Operation of the phase detection unit 110, the storage unit 120 and the output unit 130 of the embodiment of FIG. 1B, is identical to the operation of the phase detection unit 110, the storage device 120 and the output unit 130 of the embodiment of FIG. 1A.

Figure 2A:
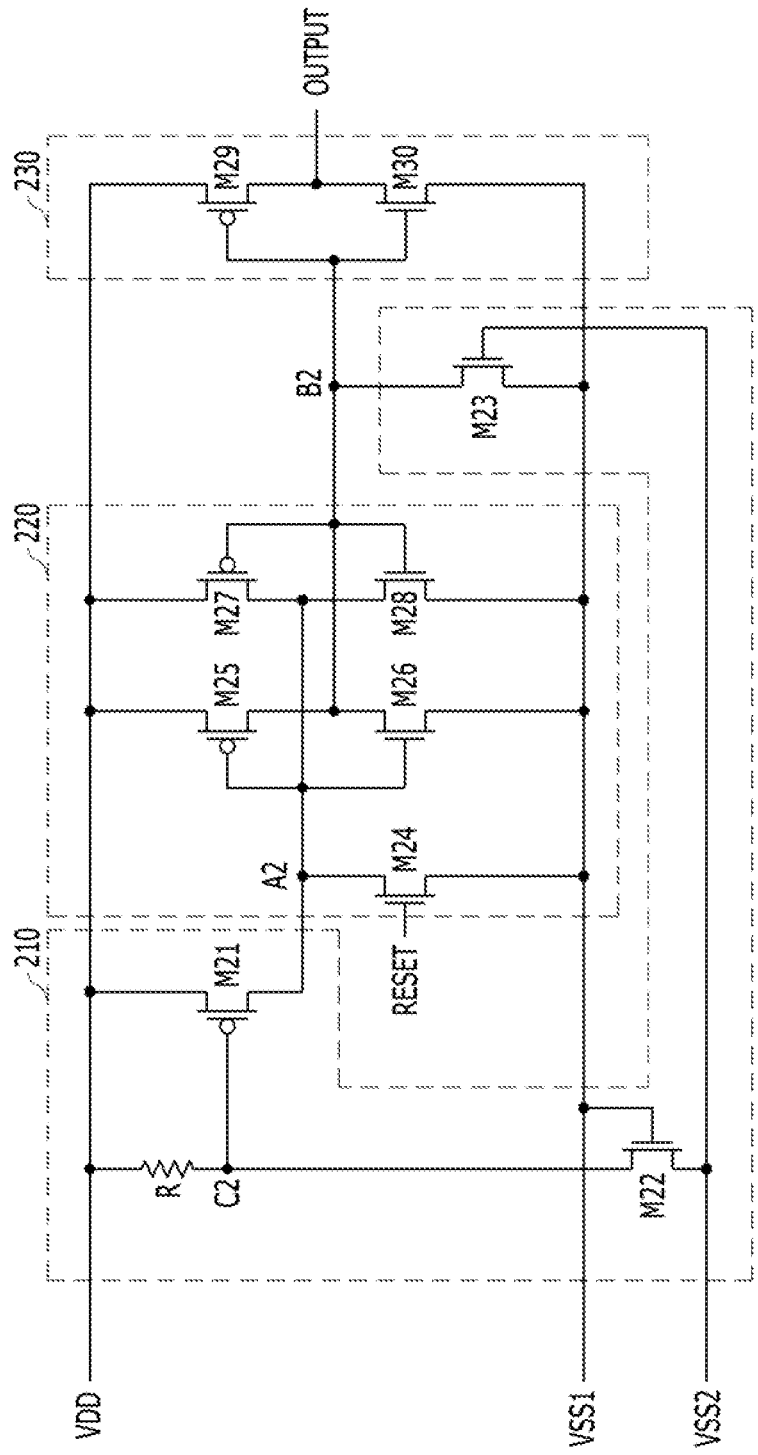
FIG. 2A is a circuit diagram illustrating a system level electrostatic discharge detection device using a ground voltage, in accordance with an embodiment of the present invention.
Figure 2B:
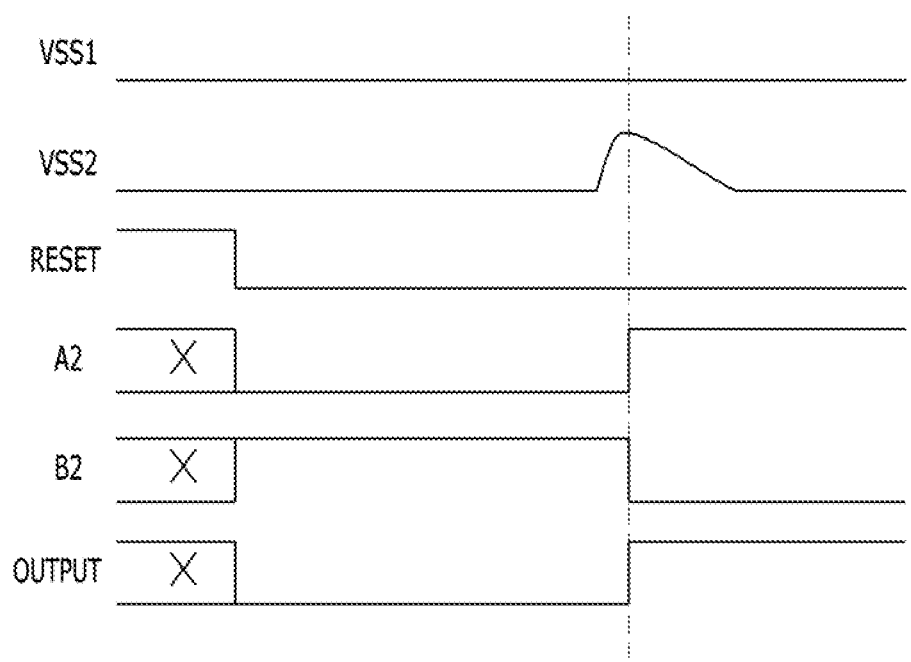
FIG. 2B is a timing diagram illustrating an operation of the system level electrostatic discharge detection shown in FIG. 2A.

FIG. 2A is a circuit diagram illustrating a system level electrostatic discharge detection device using a ground voltage VSS, in accordance with an embodiment of the present invention. FIG. 2B is a timing diagram illustrating an operation of the system level electrostatic discharge detection shown in FIG. 2A, and shows a case that a second ground voltage VSS2 is shifted to a higher voltage.

Referring to FIG. 2A, the system level electrostatic discharge detection device using the ground voltage VSS includes a phase detection unit 210, a storage unit 220 and an output unit 230.

The phase detection unit 210 includes a first PMOS transistor M21, a first NMOS transistor M22 and a second NMOS transistor M23.

The first PMOS transistor M21 has a source receiving a power supply voltage VDD, a drain coupled to an input terminal A2 of the storage unit 220, and a gate coupled to the source thereof through a resistor R.

The first NMOS transistor M22 has a drain coupled to the gate of the PMOS transistor M21, a gate receiving a first ground voltage VSS1, and a source receiving a second ground voltage VSS2. The first NMOS transistor M22 operates according to the second ground voltage VSS2 applied to the source thereof.

The second NMOS transistor M23 has a drain coupled to an output terminal B2 of the storage unit 220, a source receiving the first ground voltage VSS1, and a gate receiving second ground voltage VSS2. The second NMOS transistor M23 operates according to the second ground voltage VSS2 applied to the gate thereof.

As shown in FIG. 2A, the storage unit 220 may be implemented using a latch circuit, which is widely used, and the output unit 230 may be implemented using an inverter circuit, which is widely used. More specifically, the storage unit 220 includes a third NMOS transistor M24, a second PMOS transistor M25, a fourth NMOS transistor M26, a third PMOS transistor M27, a fifth NMOS transistor M28. The third NMOS transistor M24 has a source coupled to the drain of the first PMOS transistor M21 through the input terminal A2 of the storage unit 220, a gate receiving a reset signal RESET, and a drain receiving the first ground voltage VSS1. The second PMOS transistor M25 has a source receiving the power supply voltage VDD, a gate coupled to the input terminal A2 of the storage unit 220, and a drain coupled to a source of the fourth NMOS transistor M26 through a third node C2. The fourth NMOS transistor M26 has the source coupled to the drain of the second PMOS transistor M25 through the third node C2, a gate coupled to the gate of the second PMOs transistor M25 and a drain receiving the first ground voltage VSS1. The third PMOS transistor M27 has a drain receiving the power supply voltage VDD a gate coupled to a gate of the fifth NMOS transistor M28, and a source coupled to a drain of the fifth NMOS transistor M28. The fifth NMOS transistor M28 has the drain coupled to the source of the third PMOS transistor M27, a gate coupled to the gate of the third PMOS transistor M27 and a source receiving the first ground voltage VSS1. The output unit 230 includes a fourth PMOS transistor M29 and a sixth NMOS transistor M30. The fourth PMOS transistor M29 has a source receiving the power supply voltage VDD, a gate coupled to a gate of the sixth NMOS transistor M30, and a drain coupled to a source of the sixth NMOS transistor M30. The sixth NMOS transistor M30 has the source coupled to the drain of the fourth PMOS transistor M29, the gate coupled to the gate of the fourth PMOS transistor M29 and a drain receiving the first ground voltage VSS1.

An operation of the system level electrostatic discharge detection device will be described with reference to FIGS. 2A and 2B.

The storage unit 220 is initialized by a reset signal RESET applied to the storage device 220. The first ground voltage VSS1 is provided to a first node A1 in response to the reset signal RESET having a logic high level, and is not provided to a second node B2 through a second NMOS transistor M23 due to inactivation of the second NMOS transistor caused by the second ground voltage VSS2 having a logic low level. Thus, a first node A2 as the input terminal of the storage unit 220 has a logic low level and a second node B2 as the output terminal of the storage unit 220 has a logic high level. As the result, the output unit 230 outputs a system level electrostatic discharge detection signal OUTPUT inactivated to a logic low level.

When a system level electrostatic discharge occurs, a phase difference between the first ground voltage VSS1 and the second ground voltage VSS2 is generated. Since the system level electrostatic discharge detection device operates based on the first ground voltage VSS1, the first ground voltage VSS1 is fixed to zero voltage, and the second ground voltage VSS2 is fluctuated to a higher voltage or a lower voltage than the first ground voltage VSS1.

If the second ground voltage VSS2 is shifted to the higher voltage as shown in FIG. 2B, the second NMOS transistor M23 is turned on, and the second node B2 shifts from the logic high level to the logic low level. Thus, the system level electrostatic discharge detection signal OUTPUT of the output unit 230 is shifted and activated from the logic low level to the logic high level. That is, the system level electrostatic discharge detection signal OUTPUT which indicates the occurrence of the system level electrostatic discharge is outputted.

If the second ground voltage VSS2 is shifted to the lower voltage, the first NMOS transistor M22 is turned on, and a third node C2 at which the drain of the first NMOS transistor M22 is coupled to the gate of the PMOS transistor M21 shifts from the logic high level to the logic low level. Thus, the PMOS transistor M21 is turned on, the first node A2 shifts from the logic low level to the logic high level. At the same time, the second node B2 shifts from the logic high level to the logic low level. That is, the system level electrostatic discharge detection signal of the output unit 230 is shifted and activated from the logic low level to the logic high level, and the system level electrostatic discharge detection signal OUTPUT which indicates the occurrence of the system level electrostatic discharge is outputted.

Figure 3A:
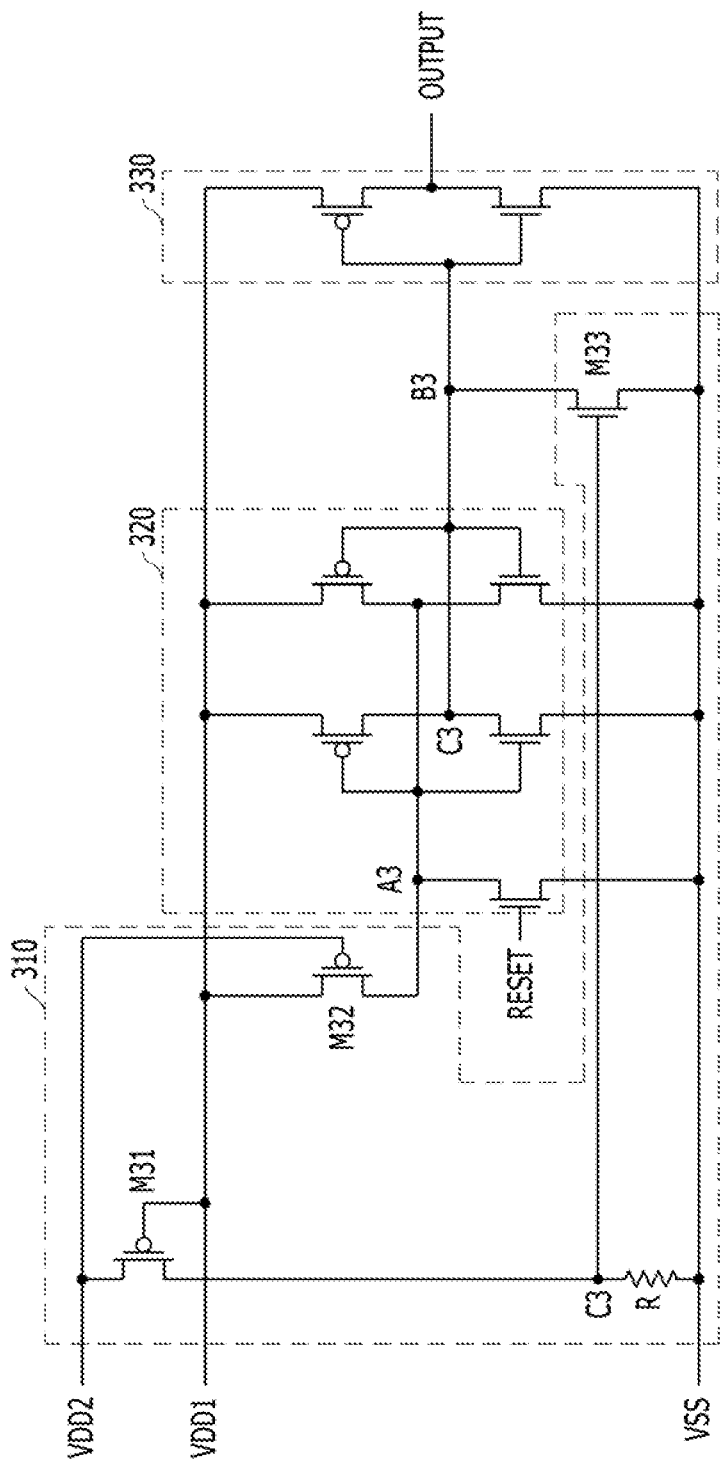
FIG. 3A is a circuit diagram illustrating a system level electrostatic discharge detection device using a power supply voltage, in accordance with an embodiment of the present invention.
Figure 3B:
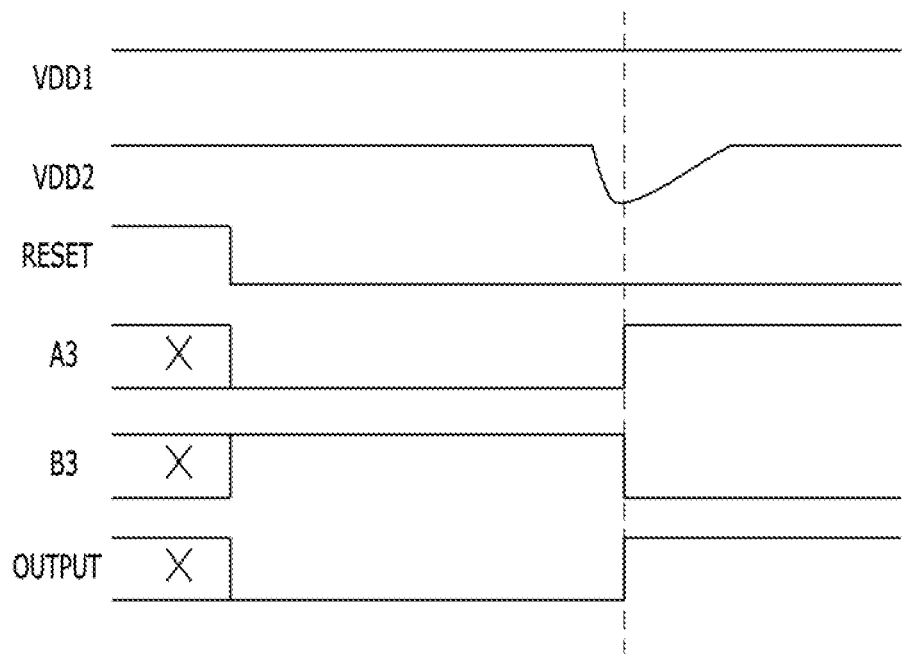
FIG. 3B is a timing diagram illustrating an operation of the system level electrostatic discharge detection shown in FIG. 3A.

FIG. 3A is a circuit diagram illustrating a system level electrostatic discharge detection device using a power supply voltage VDD, in accordance with an embodiment of the present invention. FIG. 3B is a timing diagram illustrating an operation of the system level electrostatic discharge detection shown in FIG. 3A, and shows a case that a second power supply voltage VDD2 is shifted to a lower voltage.

Referring to FIG. 3A, the system level electrostatic discharge detection device using the power supply voltage in accordance with the embodiment of the present invention includes a phase detection unit 310, a storage unit 320 and an output unit 330.

The phase detection unit 310 includes a first PMOS transistor M31, a second PMOS transistor M32, an NMOS transistor M33 and a resistor R.

The first PMOS transistor M31 has a drain coupled to a ground voltage (VSS) terminal through the resistor R, a gate receiving a first power supply voltage VDD1, and a source receiving a second power supply voltage VDD2. The first PMOS transistor M31 operates according to the second power supply voltage VDD2 applied to the source thereof.

The second PMOS transistor M32 has a source receiving the first power supply voltage VDD1, a drain coupled to a first node A3 which is an input terminal of the storage unit 320, and a gate receiving the second power supply voltage VDD2. The second PMOS transistor M32 operates according to the second power supply voltage VDD2 applied to the gate thereof.

The NMOS transistor M33 has a drain coupled to a second node B3 which is an output terminal of the storage unit 320, a source coupled to the ground voltage (VSS) terminal, and a gate coupled to the drain of the first PMOS transistor M31 at a third node C3.

As shown in FIG. 3A, the storage unit 320 may be implemented using a latch circuit, and the output unit 330 may be implemented using an inverter circuit, identical to the latch circuit and inverter circuit of FIG. 2A, respectively. Thus, the detailed descriptions of the storage unit 320 and the output unit 330 will be omitted.

An operation of the system level electrostatic discharge detection device will be described with reference to FIGS. 3A and 3B.

The storage unit 320 is initialized by a reset signal RESET as described above with reference to the embodiment of FIG. 2A. Upon initialization, the first node A3 which is the input terminal of the storage unit 320 has a logic low level and the second node B3 which is the output terminal of the storage unit 320 has a logic high level. As the result, the output unit 330 outputs a system level electrostatic discharge detection signal OUTPUT inactivated to a logic low level.

When a system level electrostatic discharge occurs, a phase difference between the first power supply voltage VDD1 and the second power supply voltage VDD2 is generated. Since the system level electrostatic discharge detection device operates on the basis of the first power supply voltage VDD1, the first power supply voltage VDD1 is fixed to a power supply voltage corresponding to a logic high level, and the second power supply voltage VDD2 is fluctuated to a higher voltage or a lower voltage than the first power supply voltage VDD1.

If the second power supply voltage VDD2 is shifted to the lower voltage as shown in FIG. 3B, the second PMOS transistor M32 is turned on, the first node A3 shifts from the logic low level to the logic high level. At the same time, the second node B3 shifts from the logic high level to the logic low level because the ground voltage VSS is provided to a third node C3 corresponding to the second node B3 when the first node A3 has the logic high level. When B3 shifts to the logic low level, the PMOS transistor of the output unit 330 is turned on while the NMOS transistor of the output unit 330 is turned off, thus, the system level electrostatic discharge detection signal OUTPUT of the output unit 330 is shifted and activated from the logic low level to the logic high level. That is, the system level electrostatic discharge detection signal OUTPUT which indicates the occurrence of the system level electrostatic discharge is outputted.

If the second power supply voltage VDD2 is shifted to the higher voltage the first PMOS transistor M31 is turned on, and the third node C2 shifts to the logic high level. Thus, the NMOS transistor M33 is turned on. Also, the second node B3 shifts from the logic high level to the logic low level. That is, the system level electrostatic discharge detection signal OUTPUT of the output unit 330 is shifted and activated from the logic low level to the logic high level, and the system level electrostatic discharge detection signal OUTPUT which indicates the occurrence of the system level electrostatic discharge is outputted.

Figure 4A:
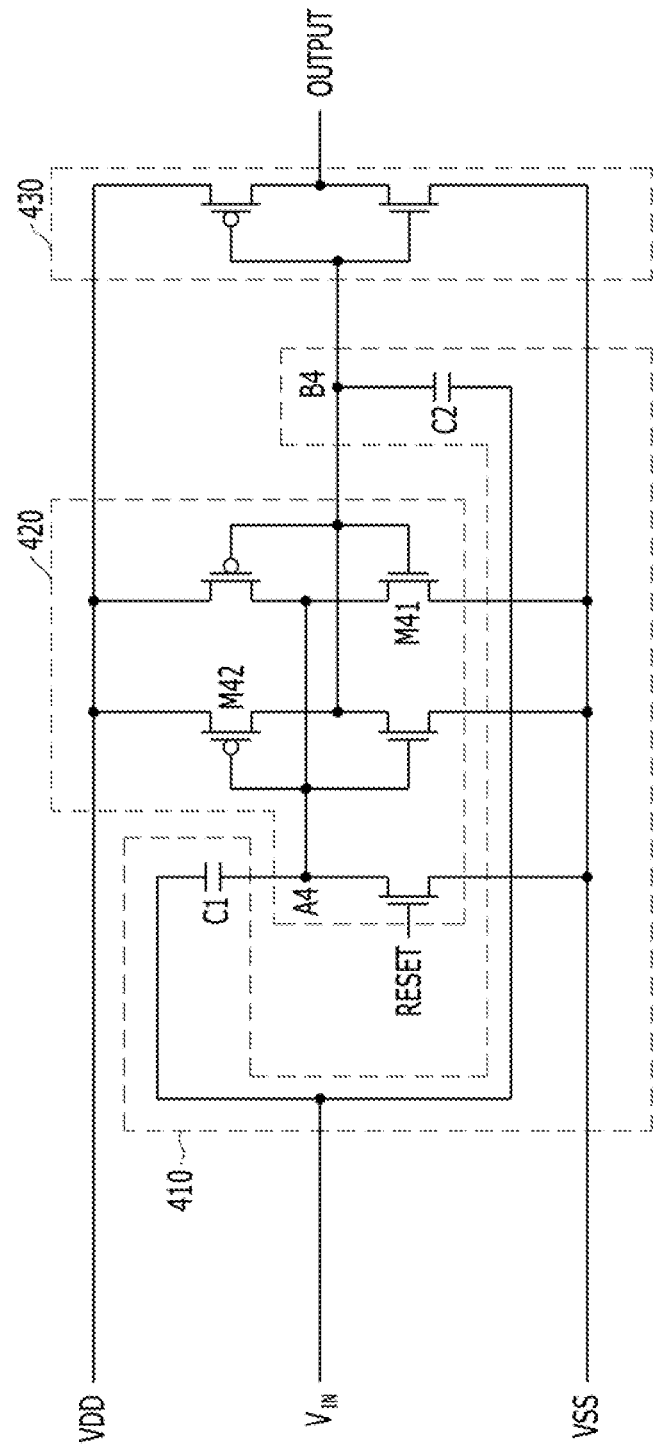
FIG. 4A is a circuit diagram illustrating a system level electrostatic discharge detection device using an input signal, in accordance with an embodiment of the present invention.
Figure 4B:
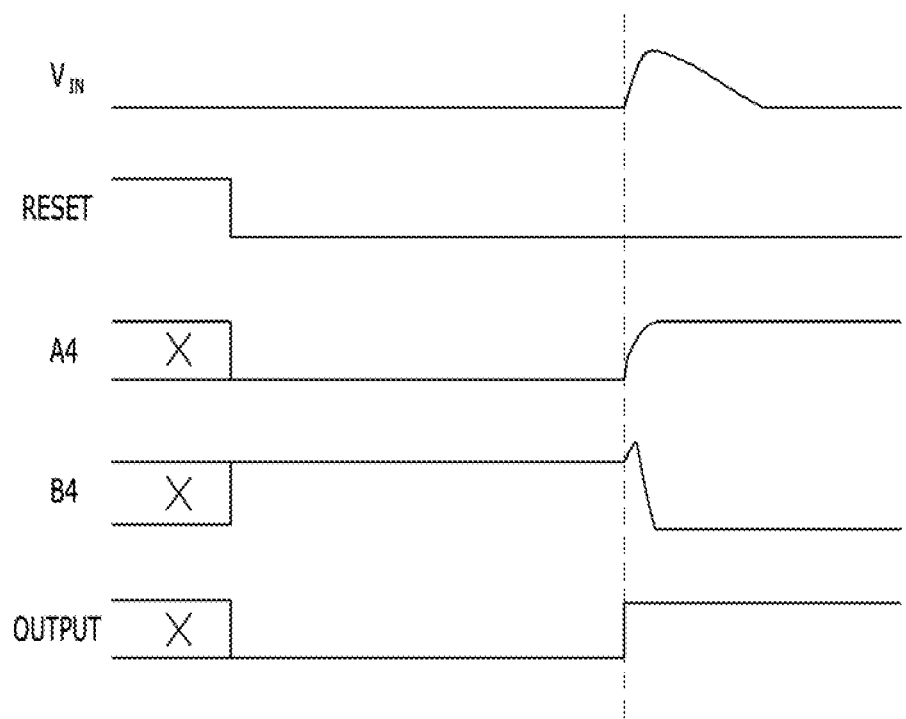
FIG. 4B is a timing diagram illustrating an operation of the system level electrostatic discharge detection shown in FIG. 4A.

FIG. 4A is a circuit diagram illustrating a system level electrostatic discharge detection device using an input signal, in accordance with an embodiment of the present invention. FIG. 4B is a timing diagram illustrating an operation of the system level electrostatic discharge detection shown in FIG. 4A, and shows a case that an input signal is shifted to a higher voltage.

Referring to FIG. 4A, the system level electrostatic discharge detection device using the input signal includes a phase detection unit 410, a storage unit 420 and an output unit 430.

The phase detection unit 410 includes a first capacitor C1 and a second capacitor C2.

The first capacitor C1 includes a first terminal receiving an input signal $V_{IN}$, e.g., DC input signal, and a second terminal coupled to a first node A4 which is an input terminal of the storage unit 420. The second capacitor C2 includes a first terminal receiving the input signal $V_{IN}$, and a second terminal coupled to a second node B4 which is an output terminal of the storage unit 420.

As shown in FIG. 4A, the storage unit 420 and the output unit 430 may be implemented using the same latch circuit, and the inverter circuit, as described above with reference to FIGS. 2A and 3A.

An operation of the system level electrostatic discharge detection device will be described with reference to FIGS. 4A and 4B.

The storage unit 420 is initialized by a reset signal RESET to set the first node A4 to a logic low level, and the second node B4 to a logic high level. As the result, the output unit 430 outputs a system level electrostatic discharge detection signal OUTPUT inactivated to a logic low level.

When a system level electrostatic discharge occurs, a phase difference between the input signal $V_{IN}$ and the ground voltage VSS is generated. Herein since the system level electrostatic discharge detection device operates on the basis of the ground voltage VSS, a glitch may occur in the input signal VIN, to have a higher voltage or a lower voltage than the ground voltage VSS.

If the input signal $V_{IN}$ is shifted to the lower voltage, both of the first node A4 and the second node B4 must be shifted to a logic low level by the first capacitor C1 and the second capacitor C2. But, since a voltage of the first node A4 having the logic low level is clamped by a parasitic diode of a NMOS transistor M41 included in the storage unit 420, the voltage of the first node A4 is not influenced, and only the second node B4 is influenced to be shifted from the logic high level to the logic low level. The storage unit 420 holds this data. Thus, the system level electrostatic discharge detection signal OUTPUT of the output unit 430 is shifted and activated from the logic low level to the logic high level. That is, the system level electrostatic discharge detection signal OUTPUT which indicates the occurrence of the system level electrostatic discharge is outputted.

Meanwhile, if the input signal $V_{IN}$ is shifted to a higher voltage as shown in FIG. 4B, both of the first node A4 and the second node B4 must be shifted to a logic high level by the first capacitor C1 and the second capacitor C2. However, since a voltage of the second node B4 having the logic high level is clamped by a parasitic diode of a PMOS transistor M42 included in the storage unit 420, the voltage of the second node B4 is not influenced, and only the voltage of the first node A4 is influenced to be shifted from the logic low level to the logic high level. The storage unit 420 holds this data, and the voltage of the second node B4 is shifted from the logic high level to the logic low level. Thus, the system level electrostatic discharge detection signal OUTPUT of the output unit 430 is shifted and activated from the logic low level to the logic high level. That is, the system level electrostatic discharge detection signal OUTPUT which indicates the occurrence of the system level electrostatic discharge is outputted.

Figure 5A:
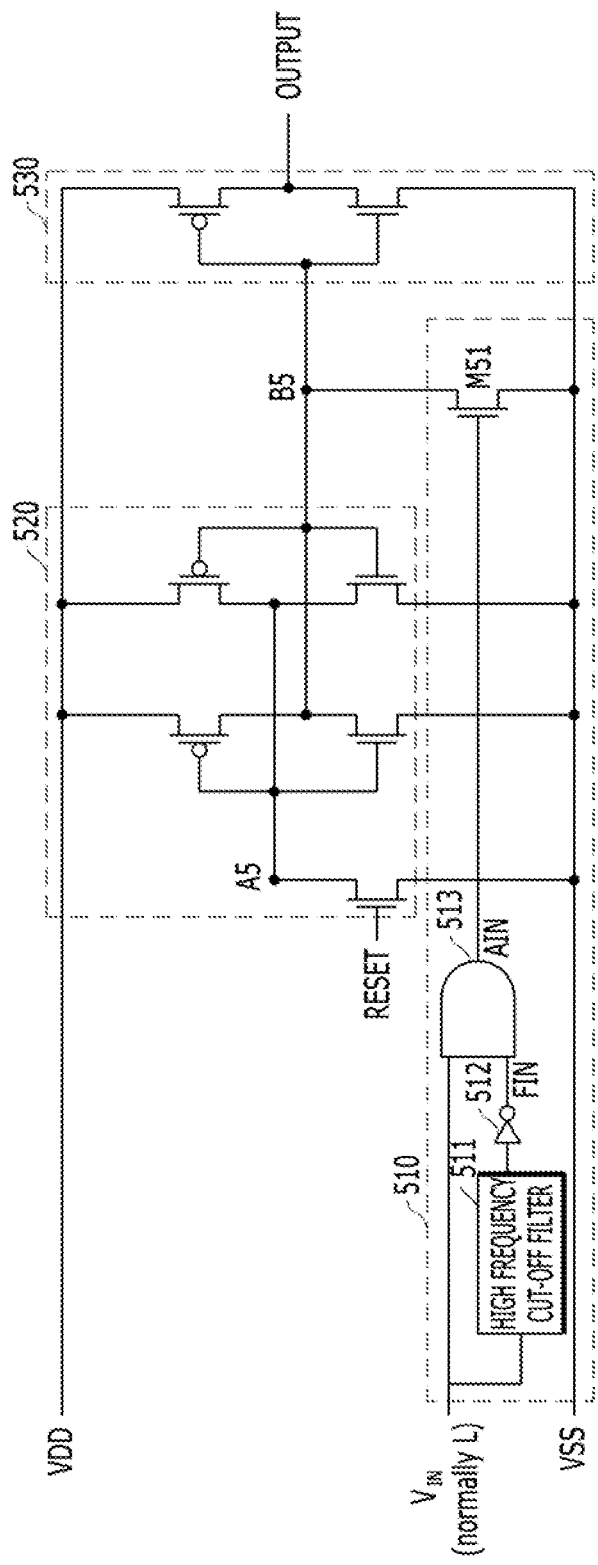
FIG. 5A is a circuit diagram illustrating a system level electrostatic discharge detection device using an input signal having a relatively large phase variation, in accordance with an embodiment of the present invention.
Figure 5B:
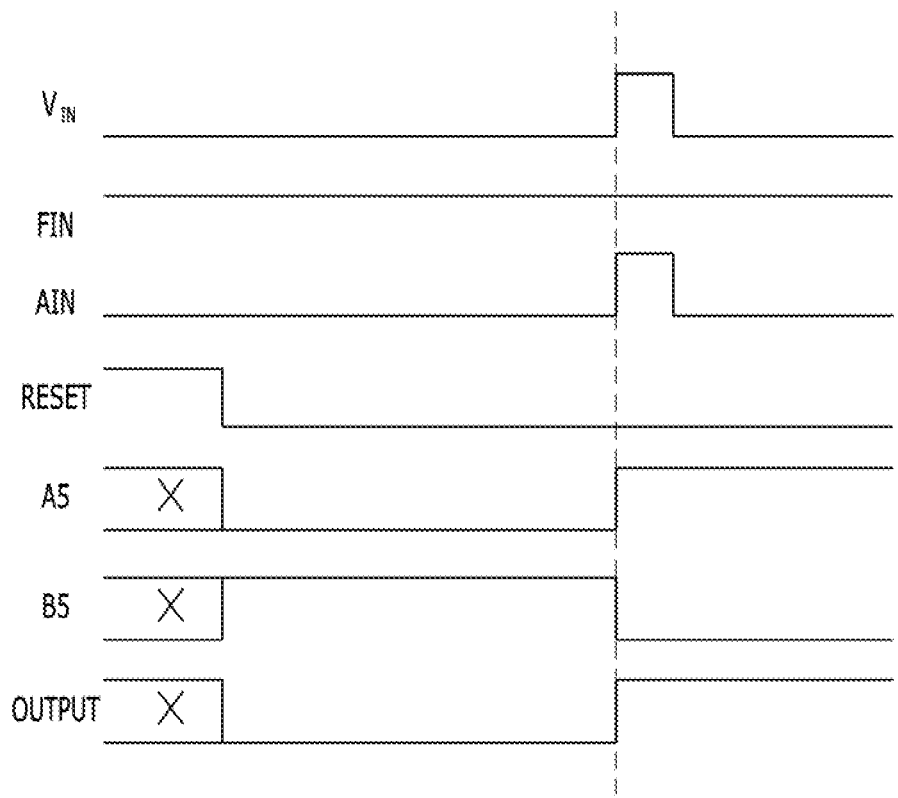
FIG. 5B is a timing diagram illustrating an operation of the system level electrostatic discharge detection shown in FIG. 5.

FIG. 5A is a circuit diagram illustrating a system level electrostatic discharge detection device using an input signal having a relatively large phase variation, in accordance with an embodiment of the present invention. FIG. 5B is a timing diagram illustrating an operation of the system level electrostatic discharge detection shown in FIG. 5A.

Referring to FIG. 5A, the system level electrostatic discharge detection device using the input signal having the relatively large phase variation includes a phase detection unit 510, a storage unit 520 and an output unit 530.

The phase detection unit 510 includes a high frequency cut-off filter 511, an inverter 512, a logic AND gate 513 and an NMOS transistor M51.

The high frequency cut-off filter 511 filters a high frequency of the input signal $V_{IN}$, e.g., a DC input signal in a case of a normally low level. The inverter 512 inverts a filtered input signal outputted from the high frequency cut-off filter 511, and output an inverted input signal FIN. The logic AND gate 513 detects a glitch by performing an AND operation on the inverted input signal FIN and the input signal $V_{IN}$. The NMOS transistor M51 has a drain coupled to a second node B5 as an output terminal of the storage unit 520, a source coupled to a ground voltage (VSS) terminal, and a gate receiving an output signal AIN of the logic AND gate 513.

In case that the input signal VIN has a normally logic high level, a NOR gate, which detects the glitch by performing a NOR operation on the input signal VIN and the inverted input signal FIN, may be implemented instead of the AND gate 513. The AND gate 513 and the NOR gate may be referred as a glitch detector.

As shown in FIG. 5A, the storage unit 520 and the output unit 530 may be implemented using the same latch circuit and inverter circuit, respectively, as described above. Thus, the detailed descriptions of the storage unit 520 and the output unit 530 will not be repeated herein.

An operation of the system level electrostatic discharge detection device will be described with reference to FIGS. 5A and 5B.

The storage unit 520 is initialized by a reset signal RESET setting a first node A5 which is an input terminal of the storage unit 520 to a logic low level, and the second node B5 which is the output terminal of the storage unit 520 to a logic high level. As the result, the output unit 530 outputs a system level electrostatic discharge detection signal OUTPUT inactivated to a logic low level.

When a system level electrostatic discharge occurs, a phase difference between the input signal $V_{IN}$ and the ground voltage VSS is generated. Herein, if a phase of the input signal $V_{IN}$ is greatly varied, the input signal $V_{IN}$ has a glitch characteristic corresponding to a digital pulse.

Thus, in order to differentiate a toggle of a normal input signal from an occurrence of the system level electrostatic discharge, after the input signal $V_{IN}$ is filtered by the high frequency cut-off filter 511, the glitch is detected by performing a logic AND operation in case of the input signal having a logic low level and by performing a logic NOR operation in case of the input signal having a logic high level. The high frequency cut-off filter 511 may be implemented with a resistor-capacitor delay type.

If the glitch is detected, the NMOS transistor M51 is turned on in response to the output signal AIN, and a voltage of the second node B5 is shifted from the logic high level to the logic low level, and the storage unit 520 holds this data. Thus, the system level electrostatic discharge detection signal OUTPUT of the output unit 530 is shifted and activated from the logic low level to the logic high level. That is, the system level electrostatic discharge detection signal OUTPUT which indicates the occurrence of the system level electrostatic discharge is outputted.

FIG. 6 is a circuit diagram illustrating a system level electrostatic discharge detection device using a ground voltage VSS, a power supply voltage VDD, an input signal and an input signal having a relatively large phase variation, in accordance with an embodiment of the present invention.

Referring to FIG. 6, the system level electrostatic discharge detection device in accordance with the embodiment of the present invention includes a phase detection unit 610, a storage unit 620 and an output unit 630.

The phase detection unit 610 includes a first phase detector 611, a second phase detector 612, a third phase detector 613 and a fourth phase detector 614. The first phase detector 611 is implemented using a first ground voltage VSS1 and a second ground voltage VSS2 and the second phase detector 612 is implemented using a first power supply voltage VDD1 and a second power supply voltage VDD2. The third phase detector 613 is implemented using an input signal VIN. The fourth phase detector 614 is implemented using an input signal VIN having a relatively large phase variation. The first phase detector 611, the second phase detector 612, the third phase detector 613 and the fourth phase detector 614 may respectively correspond to the system level electrostatic discharge detection device shown in FIGS. 2A, 3A, 4A and 5A. Detailed configurations and operations of the first phase detector 611, the second phase detector 612, the third phase detector 613 and the fourth phase detector 614 will be omitted since configurations and operations of the phase detection unit are above-described with reference to FIGS. 2A to 5B.

As shown in FIG. 6, the storage unit 620 and the output unit 630 may be implemented using the same latch circuit and inverter circuit as described above with FIGS. 2A to 5B. Thus, detailed descriptions of the storage unit 620 and the output unit 636 will be omitted herein.

According to an embodiment of the present invention, a phase detection unit may include one or more phase detectors. For example, a phase detection unit may include one phase detector as shown in FIGS. 2A to 5B, or may include four phase detectors as shown in FIG. 6.

Figure 7A:
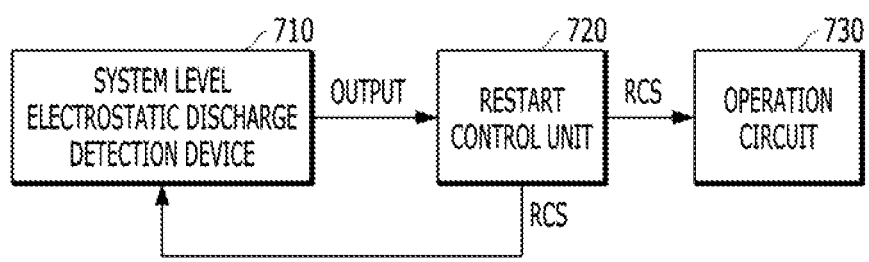
FIG. 7A is a block diagram illustrating a restart system in accordance with an embodiment of the present invention.
Figure 7B:
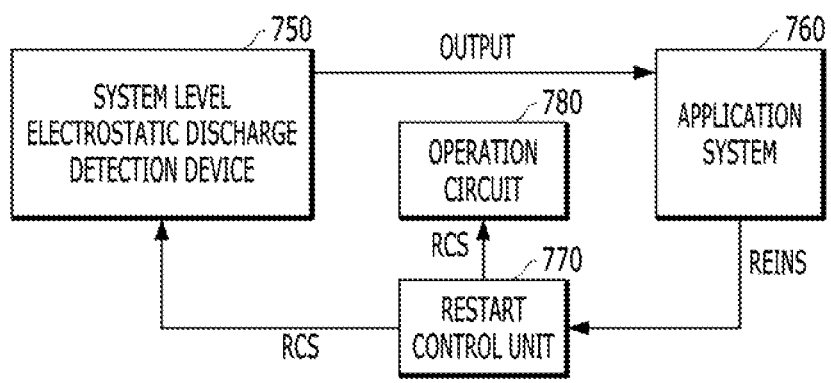
FIG. 7B is a block diagram illustrating a restart system in accordance with another embodiment of the present invention.

FIG. 7A is a block diagram illustrating a restart system in accordance with an embodiment of the present invention. FIG. 7B is a block diagram illustrating a restart system in accordance with another embodiment of the present invention. The restart system shown in FIGS. 7A and 7B may be implemented using the above-described system level electrostatic discharge detection device.

Referring to FIG. 7A, the restart system includes a system level electrostatic discharge detection device 710, a restart control unit 720 and an operation circuit 730.

The system level electrostatic discharge detection device 710 detects a phase difference between a plurality of supply voltages or between a plurality of input signals, and outputs a system level electrostatic discharge detection signal OUTPUT. The restart control unit 720 generates a restart control signal RCS for controlling a restart operation according to the system level electrostatic discharge detection signal OUTPUT outputted from the system level electrostatic discharge detection device 710. The operation circuit 730 performs the restart operation according to the restart control signal RCS outputted from the restart control unit 720.

Herein, the reset control unit 720 may further output the restart control signal RCS to the system level electrostatic discharge detection device 710 according to the system level electrostatic discharge detection signal OUTPUT. The system level electrostatic discharge detection unit 710 may further perform a restart operation according to the restart control signal RCS.

The operation circuit 730 may include a semiconductor circuit of an image sensor.

As shown in FIG. 7B, the restart system in accordance with an embodiment of the present invention includes a system level electrostatic discharge detection device 750, an application system 760, a restart control unit 770 and an operation circuit 780.

The system level electrostatic discharge detection device 750 detects a phase difference between a plurality of supply voltages or between a plurality of input signals, and outputs a system level electrostatic discharge detection signal OUTPUT. The application system 760 outputs a restart instruction signal REINS for instructing a restart operation according to the system level electrostatic discharge detection signal OUTPUT outputted from the system level electrostatic discharge detection device 750. The restart control unit 770 generates a restart control signal RCS for controlling the restart operation according to the restart instruction signal REINS outputted from the application system 760. The operation circuit 780 performs the restart operation according to the restart control signal RCS outputted from the restart control unit 770.

Herein, the restart control unit 770 may further output the restart control signal RCS to the system level electrostatic discharge detection device 750 according to the restart instruction signal REINS. The system level electrostatic discharge detection device 750 may further perform a restart operation according to the restart control signal RCS. The operation circuit 780 may include a semiconductor circuit of an image sensor.

The system level electrostatic discharge detection device in accordance with embodiments of the present invention may correctly detect the occurrence of the system level electrostatic discharge by detecting and storing a phase difference between a plurality of supply voltages or between a plurality of input signals.

The system level electrostatic discharge detection device in accordance with embodiments of the present invention may let a corresponding system operate normally by restarting the corresponding system using the system level electrostatic discharge detection signal outputted from the system level electrostatic discharge detection device.

The system level electrostatic discharge detection device in accordance with embodiments of the present invention may let a semiconductor circuit manufacturer easily address issues, which occur in a final production quality evaluation, and a semiconductor circuit including a system level electrostatic discharge detection device in accordance with embodiments of the present invention may be easily mounted on electronic products. A malfunction of the electronic products caused by the electronic discharge (ESD) may be prevented.

Although various embodiments of the present invention have been described for illustrative purposes it will be apparent to those skilled in the art that various changes and modifications may be made without departing from the spirit and scope of the invention as defined in the following claims.

What is claimed is:

1. A system level electrostatic discharge (ESD) detection device, comprising:
   a phase detection unit including at least one phase detector suitable for detecting a phase difference between a plurality of supply voltages or between a plurality of input signals;
   a storage unit suitable for shifting between a first and a second state, the second state indicating a phase difference detected by the phase detection unit;
   an output unit suitable for outputting a system level electrostatic discharge (ESD) detection signal according to the first or second state of the storage unit; and
   an input control unit including at least one input controller suitable for generating the plurality of supply voltages or the plurality of input signals using a single supply voltage or a single input signal, and outputting the plurality of supply voltages or the plurality of input signals to the phase detection unit.

2. The system level ESD detection device of claim 1, wherein the phase detection unit comprises at least one of
   a first phase detector suitable for detecting a phase difference between a first power supply voltage and a second power supply voltage;
   a second phase detector suitable for detecting a phase difference between a first ground voltage and a second ground voltage; and
   a third phase detector suitable for detecting a phase difference between a first input signal and a second input signal,
   wherein the phase detection unit outputs a phase difference detection signal to the storage unit according to the phase difference detected by at least one of the first phase detector, the second phase detector and the third phase detector.

3. The system level ESD detection device of claim 1, wherein the storage unit shifts to and maintains the phase difference state for as long as the phase difference detection signal is being outputted from the phase detection unit.

4. The system level ESD detection device of claim 1, wherein the output unit outputs a system level ESD detection signal to a restart control unit or an application processor according to the phase difference stored in the storage unit.

5. The system level ESD detection device of claim 1, wherein the input control unit comprises at least one of
   a first input controller suitable for generating a first power supply voltage and a second power supply voltage using a single power supply voltage, and applying the first power supply voltage and the second power supply voltage to the phase detection unit;
   a second input controller suitable for generating a first ground voltage and a second ground voltage using a single ground voltage, and applying the first ground voltage and the second ground voltage to the phase detection unit; and
   a third input controller suitable for generating a first input signal and a second input signal using a single input signal, and applying the first input signal and the second input signal to the phase detection unit.

6. The system level ESD detection device of claim 5, wherein the first input controller, the second input controller and the third input controller are implemented with a filter or a delay circuit.

7. The system level ESD detection device of claim 1, wherein the phase detection unit comprises:
   a PMOS transistor having a source receiving a power supply voltage, a drain coupled to an input terminal of the storage unit, and a gate coupled to the source thereof through a resistor;
   a first NMOS transistor having a drain coupled to the gate of the PMOS transistor, a gate receiving a first ground voltage, and a source receiving a second ground voltage, wherein the first NMOS transistor operates according to the second ground voltage; and
   a second NMOS transistor having a drain coupled to an output terminal of the storage unit, a source receiving the first ground voltage, and a gate receiving the second ground voltage, wherein the second NMOS transistor operates according to the second ground voltage.

8. The system level ESD detection device of claim 1, wherein the phase detection unit comprises:
   a first PMOS transistor having a drain coupled to a ground voltage terminal through a resistor, a gate receiving a first power supply voltage, and a source receiving a second power supply voltage, wherein the first PMOS transistor operates according to the second power supply voltage;
   a second PMOS transistor having a source receiving the first power supply voltage, a drain coupled to an input terminal of the storage unit, and a gate receiving the second power supply voltage, wherein the second PMOS transistor operates according to the second power supply voltage; and
   an NMOS transistor having a drain coupled to an output terminal of the storage unit, a source coupled to the ground voltage terminal, and a gate coupled to the drain of the first PMOS transistor.

9. The system level ESD detection device of claim 1, wherein the phase detection unit comprises:

a first capacitor having a first terminal receiving an input signal and a second terminal coupled to an input terminal of the storage unit; and a second capacitor having a first terminal receiving the input signal and a second terminal coupled to an output terminal of the storage unit.

10. The system level ESD detection device of claim 1, wherein the phase detection unit comprises:

a high frequency cut-off filter suitable for filtering a high frequency of the input signal;

an inverter suitable for inverting a filtered input signal outputted from the high frequency cut-off filter;

a glitch detector suitable for detecting a glitch according to the input signal and an inverted input signal outputted from the inverter; and an NMOS transistor having a drain coupled to an output terminal of the storage unit, a source coupled to a ground voltage terminal, and a gate receiving an output signal of the glitch detector.

11. A restart system comprising:

a system level electrostatic discharge (ESD) detection device suitable for detecting a phase difference between a plurality of supply voltages or between a plurality of input signals, and outputting a system level electrostatic discharge (ESD) detection signal;

a restart control unit suitable for generating a restart control signal for controlling a restart operation according to the system level ESD detection signal; and an operation circuit suitable for performing the restart operation according to the restart control signal, wherein the system level ESD detection device comprises:

a phase detection unit including at least one phase detector suitable for detecting the phase difference between the plurality of supply voltages or between the plurality of input signals;

a storage unit suitable for storing the phase difference detected by the phase detection unit; and an output unit suitable for outputting the system level ESD detection signal according to the phase difference stored in the storage unit.

12. The restart system of claim 11, wherein the restart control unit further outputs the restart control signal to the system level ESD detection device according to the system level ESD detection signal, and the system level ESD detection device further performs a restart operation according to the restart control signal.

13. The restart system of claim 11, wherein the phase detection unit comprises at least one of a first phase detector suitable for detecting a phase difference between a first power supply voltage and a second power supply voltage;

a second phase detector suitable for detecting a phase difference between a first ground voltage and a second ground voltage; and a third phase detector suitable for detecting a phase difference between a first input signal and a second input signal, wherein the phase detection unit outputs a phase difference detection signal to the storage unit according to the phase difference detected by at least one of the first phase detector, the second phase detector and the third phase detector.

14. The restart system of claim 11, wherein the system level ESD detection device further comprises an input control unit including at least one input controller suitable for generating the plurality of supply voltages or the plurality of input signals using a single supply voltage or a single input signal, and outputting the plurality of supply voltages or the plurality of input signals to the phase detection unit.

15. A restart system comprising:

a system level electrostatic discharge (ESD) detection device suitable for detecting a phase difference between a plurality of supply voltages or between a plurality of input signals, and outputting a system level electrostatic discharge (ESD) detection signal;

an application system suitable for outputting a restart instruction signal for instructing a restart operation according to the system level ESD detection signal;

a restart control unit suitable for generating a restart control signal for controlling the restart operation according to the restart instruction signal; and an operation circuit suitable for performing the restart operation according to the restart control signal, wherein the restart control unit further outputs the restart control signal to the system level ESD detection device according to the restart instruction signal, and the system level ESD detection device further performs a restart operation according to the restart control signal.

16. The restart system of claim 15, wherein the system level ESD detection device comprises:

a phase detection unit including at least one phase detector suitable for detecting the phase difference between the plurality of supply voltages or between the plurality of input signals;

a storage unit suitable for storing the phase difference detected by the phase detection unit; and an output unit suitable for outputting the system level ESD detection signal according to the phase difference stored in the storage unit.

17. The restart system of claim 16, wherein the system level ESD detection device further comprises an input control unit including at least one input controller suitable for generating the plurality of supply voltages or the plurality of input signals using a single supply voltage or a single input signal, and outputting the plurality of supply voltages or the plurality of input signals to the phase detection unit.

\* \* \* \* \*